United States Patent
Kelly

(10) Patent No.: US 7,586,162 B1
(45) Date of Patent: Sep. 8, 2009

(54) HIGH-VALUE INTEGRATED RESISTOR AND METHOD OF MAKING

(75) Inventor: Dylan J. Kelly, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 12/150,877

(22) Filed: Apr. 30, 2008

Related U.S. Application Data

(63) Continuation of application No. 11/127,519, filed on May 11, 2005, now abandoned.

(60) Provisional application No. 60/571,074, filed on May 14, 2004.

(51) Int. Cl.
  *H01L 29/76* (2006.01)
  *H01L 29/94* (2006.01)

(52) U.S. Cl. .................. 257/380; 257/379; 257/536; 438/200

(58) Field of Classification Search .......... 257/308, 257/379, 536, 541–543, E21.004–E21.007; 438/200, 210
See application file for complete search history.

(56) References Cited

U.S. PATENT DOCUMENTS 6,136,634 A * 10/2000 Kato et al. ............... 438/200
6,208,281 B1 * 3/2001 Jinbo et al. ............... 341/154
6,369,654 B1 * 4/2002 Inagaki et al. ............ 330/293

OTHER PUBLICATIONS

Kelly, Dylan J., Declaration in Accordance with 37 CFR 1.68 filed in USPTO dated Nov. 21, 2008 for U.S. Appl. No. 12/150,877, 3 pages.
Exhibit A—First PE4256 Purchase Order dated May 16, 2003, Scientific—Altanta of Shanghai Co., Ltd.
Exhibit B—PE4256 Shipment Log.
Exhibit C—Pre May 14, 2003 PE 4256 Sampling Data.

* cited by examiner

*Primary Examiner*—Theresa T Doan
(74) *Attorney, Agent, or Firm*—Jaquez & Associates; Martin J. Jaquez, Esq.

(57) ABSTRACT

A high value resistive device in an integrated circuit is disclosed, including a pair of substantially similar resistor segments each having an elongated semiconductor channel of e.g. silicon, lightly doped as would be appropriate for a low-threshold depletion mode FET. Disposed above the channel is an insulator layer, which is preferably much thicker than a typical gate insulator thickness. A shielding conductor is disposed generally overlaying the channel, connected to and extending from one end of the channel nearly to the other end of the channel. With the overlaying conductor connected to a first end of each segment, the plurality of segments are coupled in series, having first ends coupled together or second ends coupled together. A plurality or multiplicity of such segment pairs may be coupled in series to reduce nonlinearities at increased voltage levels.

20 Claims, 2 Drawing Sheets

HIGH-VALUE INTEGRATED RESISTOR AND METHOD OF MAKING

CROSS-REFERENCE TO RELATED APPLICATIONS

Claims of Priority

This is a continuation application of co-pending and commonly assigned U.S. patent application Ser. No. 11/127,519, filed May 11, 2005 now abandoned and entitled "High-Value Integrated Resistor and Method of Making", and this application claims a benefit of priority under 35 U.S.C. § 120 to application Ser. No. 11/127,519, filed May 11, 2005 and entitled "High-Value Integrated Resistor and Method of Making", which application claims a benefit of priority under 35 U.S.C. § 119 (e) to U.S. Provisional Application No. 60/571,074, filed May 14, 2004, entitled "High-Value Integrated Resistor and Method of Making". U.S. patent application Ser. No. 11/127,519, filed May 11, 2005, entitled "High-Value Integrated Resistor and Method of Making", and Provisional Application No. 60/571,074 are both incorporated by reference herein in their entirety. This patent application is also related to commonly assigned U.S. application Ser. No. 10/267,531, filed Oct. 8, 2002, entitled "Switch Circuit and Method of Switching Radio Frequency Signals", which issued Oct. 12, 2004 as U.S. Pat. No. 6,804,502, and which, in turn, claims the benefit under 35 U.S.C. § 119 (e) to U.S. Provisional Application No. 60/328,353, filed Oct. 10, 2001, entitled "Silicon-on-Insulator RF Switches". Both the related U.S. Patent (U.S. Pat. No. 6,804,502) and the provisional Application No. 60/328,353 are incorporated by reference herein in their entirety.

1. FIELD

This disclosure generally relates to integrated circuits, and more specifically to structures serving as high-value resistors on integrated circuits.

2. RELATED ART

Integrated electronic circuits require various passive devices for use in various circuits. High-value resistors may occupy a significant amount of integrated circuit area or "real estate." Because the cost of integrated circuits is directly dependent upon the size of the entire circuit, i.e., the size of the real estate occupied by circuit components, resistors that consume significant area may adversely affect the cost of the resulting integrated circuit device.

Many integrated circuits process signals having a high frequency content. Digital integrated circuits generally possess at least sharp-edged signals, and often operate at high clock rates. Many analog integrated circuits are designed to operate with high-frequency analog signals. In either event, high-value resistors, and the high-impedance circuits that employ such resistors, may be particularly susceptible to the injection of unwanted signals.

High-frequency signals are the most easily injected, because most of the common mechanisms for such injection typically involve capacitive coupling.

Accordingly, there is a need for high-value resistors for fabrication in integrated circuits. Such high-value resistors desirably require small integrated circuit area, and are also desirably relatively immune to signal injection. These needs have led to the high-value integrated circuit resistor, and a method of making such, that is described herein.

SUMMARY

A high-value integrated circuit resistive element and a method of making the same are described.

The high-value resistor includes a plurality of resistive channel segments having first and second ends. The first ends may be referred to as "blank" ends, and are not generally directly connected to conductive material (e.g., metal) that overlies the resistive channel segment. The second ends may be referred to as "overlay" ends, and are reasonably closely connected to such conductive overlay material. The plurality of resistive channel segments may be connected in inverse series, with "blank" ends of sequential segments connected together, and "overlay" ends of other sequential resistive channel segments connected together. The resistive channel segments may be arranged in pairs of such inverse-series connected segments, with each pair connected in series to another segment.

The resistive channel segments may be lightly doped semiconductor, and may be terminated at connection regions that are more highly doped. Preferably, the doping is such as would be appropriate to fabricate a low-threshold depletion-mode FET of N or P type. A relatively thick insulating layer is disposed between the resistive channel segments and the overlying metal. Voltage-current nonlinearities may be compensated by placing a number of segment pairs in series.

BRIEF DESCRIPTION OF THE DRAWINGS

Embodiments of the present teachings will be more readily understood by reference to the following figures, in which like reference numbers and designations indicate like elements.

DETAILED DESCRIPTION

Figure 1:
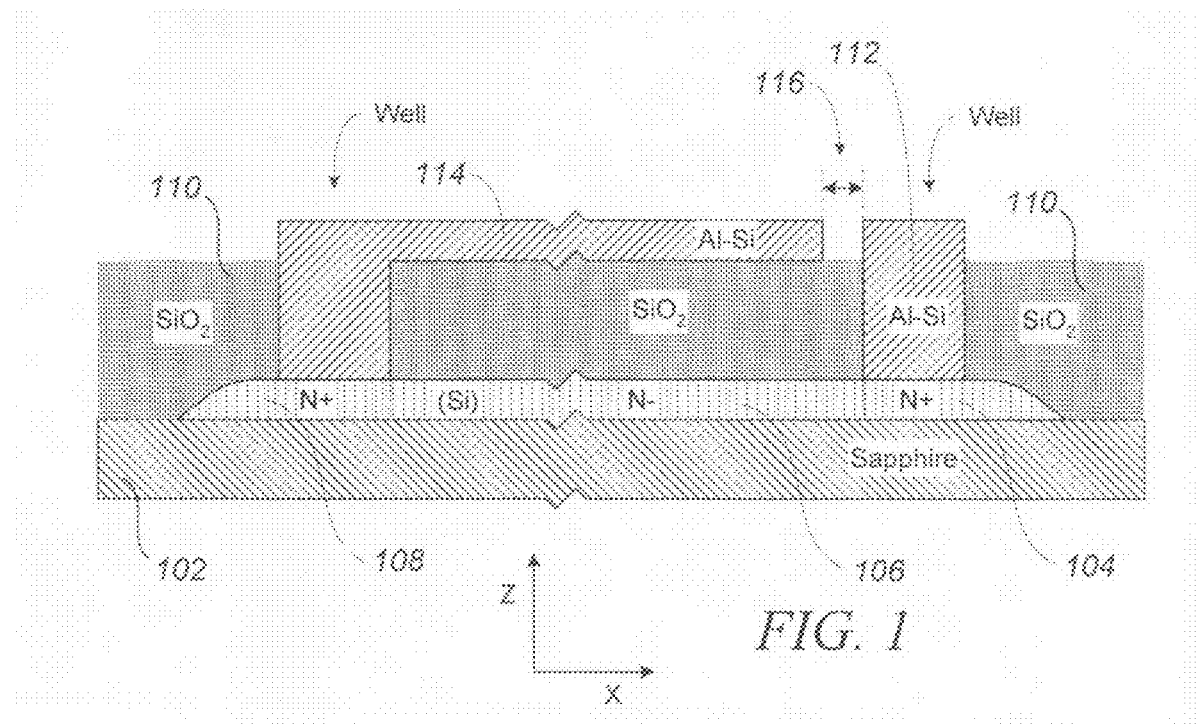
FIG. 1 shows a cross-section of a resistive channel segment fabricated in an integrated circuit.

FIG. 1 is a representation of a cross section of an exemplary embodiment of a high-value integrated circuit resistive element. A substrate 102 may, for example, comprise an insulator such as sapphire, though nearly any substrate material should be acceptable with proper process adjustments. If the substrate comprises sapphire, or other material different from the channel material used for channels of FETs in the integrated circuit, then a layer of such channel material is needed above the substrate. The channel layer may be immediately adjacent the substrate, as shown in FIG. 1, or it may be isolated therefrom, especially if isolated by means of an insulating layer. The resistive channel may comprise silicon, or other semiconductor material suitable for fabrication of the integrated circuit.

A resistive channel 106 may have a thickness suitable for a FET fabricated elsewhere on the particular integrated circuit. Such thickness may, for example, be approximately 1100 Angstroms. The resistive channel may be lightly doped, such as would be suitable for a depletion-mode FET having a low (negative) threshold voltage of between 0 and −1V, or between 0 and −2V. For example, the resistive channel 106 may be implanted with As+ at 160 keV and a density of 1.8E+12, establishing it as lightly doped "N−" silicon. End contact regions 104 and 108 of the semiconductor channel may be heavily doped to enhance contact properties. For example, in one exemplary embodiment, the contact regions may be implanted at 60 keV with As+ to a density of about 5E15.

An insulator material 110, such as $SiO_2$, may be disposed above the channel. Whereas a typical gate oxide thickness might be approximately 100 Angstroms, the insulator above the channel may be much thicker. For example, an insulator of 10000 Angstroms of $SiO_2$ may be disposed above the channel. Wells may be etched, or otherwise provided, in the insulator above the contact regions to permit a conductive layer, such as a metal contact 112, to be conductively coupled to the channel. At one end, the metal layer 112 may not extend significantly along the length (X direction) of the channel. At the other end, however, a metal layer 114 may extend from the well and contact region to overlay the channel, above the insulator 110. The metal layer will typically extend over 90% of the length of the channel, but is insulated from the other end of the channel by a gap 116 as shown in FIG. 1. The gap 116 may be as narrow as practical. Practical considerations include the maximum voltage expected across the segment, the effectiveness of an insulating layer (not shown) that fills the gap, etc.

Figure 3:
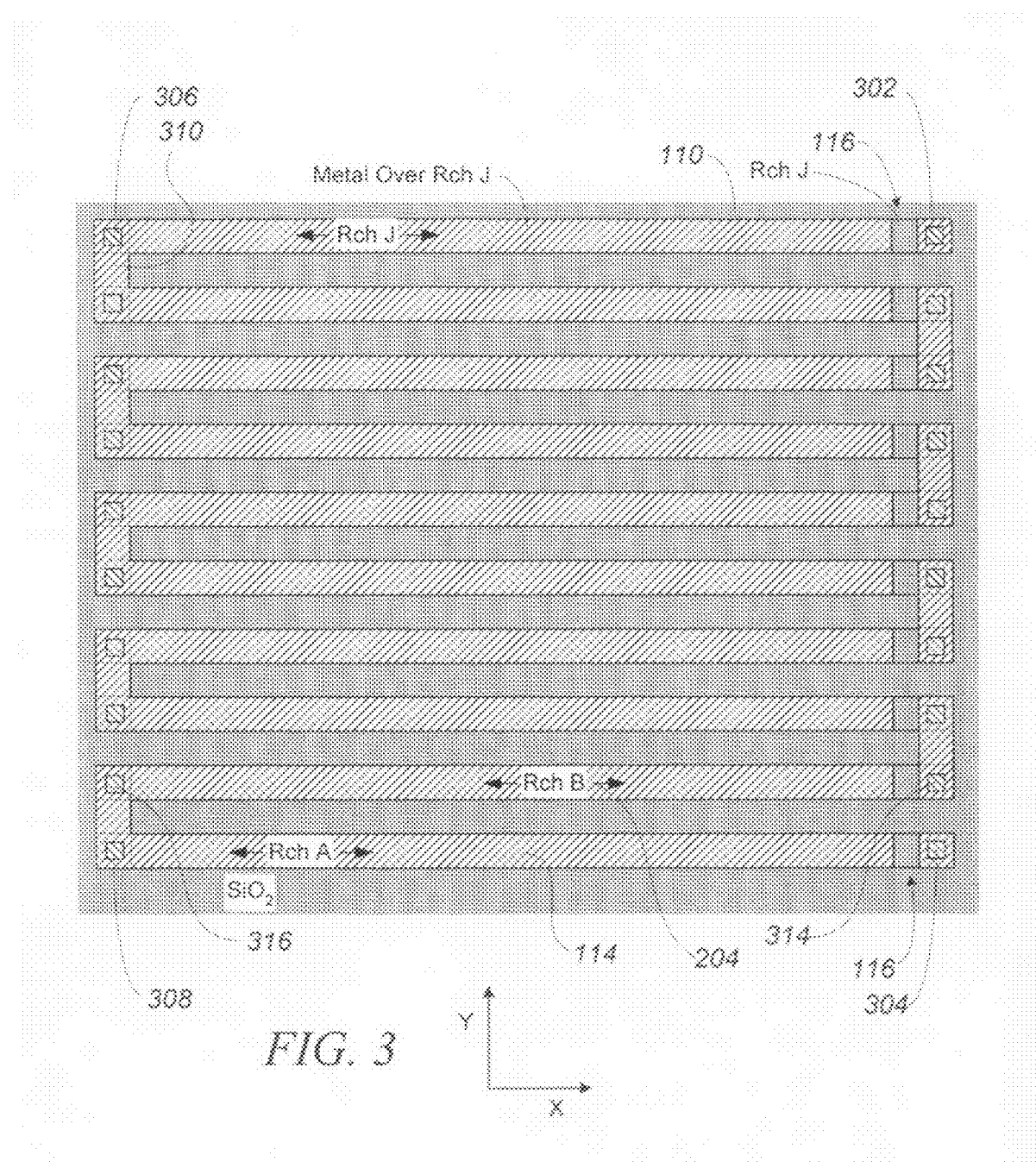
FIG. 3 is a top view of an integrated circuit layout for a series of resistive channel segment pairs.

FIG. 3 is a top view of an X-Y area of an integrated circuit that includes an embodiment of a high-value resistor. A last contact 302 is indicated, as are all other contacts, by a small square representing the well in the insulator that permits the metal layer to contact the resistive channel, as in well contact 112 of FIG. 1. A first contact 304 is similarly indicated. The high-value resistive element is typically connected at the contacts 302 and 304 to that circuit of the integrated circuit in which the resistive element is used. Around the wells of each contact region, and below the metal 114, lies the insulator 110, which may, for example, comprise $SiO_2$.

A gap 116 (corresponding to the gap 116 of FIG. 1) is disposed adjacent to each of the terminal connection regions. Adjacent to the contact region 304, resistor channel A ("Rch A") proceeds under the insulator layer, and is continuous to the opposite contact region 308 of the resistive channel segment, as shown in the X direction of the semiconductor channel 106 in FIG. 1. Following the gap 116, the metal 114 overlays the channel and continues to a contact region 308 at the opposite end of the resistor segment A (Rch A). Thus, Rch A extends as shown in FIG. 1. The width of Rch A, in the Y direction, may be as narrow as is suitable for the processing steps used in the integrated circuit. The width could be greater than a "comfortable" minimum, but there would be an increase in device area to obtain a given value of resistance.

Disposed above the resistive segment (or channel) Rch A, a number of additional segments are disposed, including Rch B 204, Rchs C, D, E, F, G, H and I, and the last segment, Rch J. All resistive channel segments A-J may be coupled in series, as is indicated in FIG. 3. It may be convenient to dispose all channels parallel to each other, as shown. However, different arrangements and configurations may also be used as convenient for differing space availability. It may be helpful to avoid further metal layers conducting high frequency signals, particularly over portions of the resistive segment string that have a high impedance to circuit common.

Each resistive segment extends the full length between contact areas near the X direction extremes. In one embodiment, insulator is present an entire length between each adjacent resistor segment, such that series connection of the segments relies upon the metal layer. Thus, in this embodiment, at the region 310 disposed between the connection region 306 of Rch J, and the adjacent connection region of Rch I, only insulator underlies the metal. Alternatively, however, the regions such as 310 that extend in the Y direction between the connected pads could include a channel similar to the channel 106 of FIG. 1. Indeed, such a channel may obviate a need for disposing metal between these regions.

The resistance of each resistive channel segment behave somewhat similar to a high-voltage FET. Thus, conduction is not entirely linear with changes in voltage. Two techniques may be employed to reduce these nonlinear effects. According to a first linearity-enhancing approach, resistive segments are disposed in pairs having opposite orientation with respect to current flow. Thus, for example, current flow from the connection region 302 to the connection region 304 passes through the resistive channel segment B from the connection region 314, through the connection region 308, and to the connection region 304. The connection regions 304 and 314 are both "blank" connection regions, similar to the region 104 of FIG. 1, that are not directly connected to the metal 114 extending above the channel. The connection regions 308 of Rch A and 316 of Rch B are "overlay" connection regions, similar to the region 108 of FIG. 1, that are directly connected to the metal 114 overlaying the resistive channel. Resistive channels Rch A and Rch B are connected together by metal disposed between the regions 308 and 316. Thus, the current in Rch B flows from a "blank" connection region 314 to an "overlay" connection region 316, while, conversely, current in Rch A flows from an "overlay" connection region 308 to a "blank" connection region 304. Resistive channel pairs may be connected at either the "overlay" connection regions, as shown for Rch A and Rch B, or at "blank" connection regions. In either event, the effect is to cancel some of the nonlinearities.

A second technique for reducing nonlinear effects in the resistive channel segments involves the use of additional resistive channel segment pairs. Because the voltage imposed from one end of the resistive segment series string (e.g., connection 302) to the opposite end (e.g., connection 304) is divided between each successive resistive segment pair, an increased number of such pairs has a correspondingly lower voltage disposed on it. Thus, each individual segment pair operates at a lower absolute voltage, within which non-linearities are less pronounced.

Disposing a metal layer over each segment channel may reduce or avoid trapped charges that might otherwise undesirably modulate the conductivity of a particular section of a resistive element string. The metal overlay may also shield the segment channels from voltage fields that might similarly modulate the conductivity of portions of resistive segments.

Figure 2:
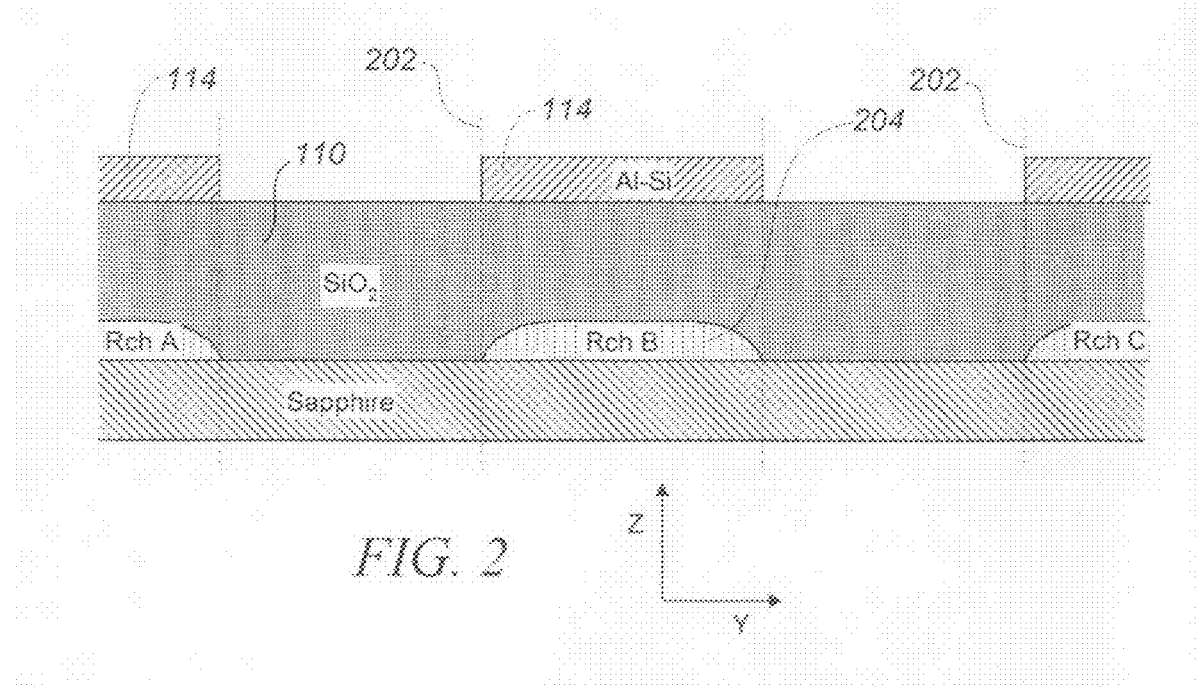
FIG. 2 shows a cross-section of portions of a series of resistive channel segments illustrated in FIG. 3.

FIG. 2 shows a cross section of the resistive segment series string of FIG. 3, at a length midpoint of the resistive segments. As shown by the Y-Z axes, the view of FIG. 2 is perpendicular to the view of FIG. 1. Resistive channel Rch B 204 is primarily shown, with Rch A and Rch C shown in part for reference. Resistive channel Rch B 204 is disposed above a sapphire (or other) substrate, and is surrounded by insulation 110. Alignment lines 202 indicate one alignment between the metal 114 overlay, and the resistive channel Rch B 204. As shown, the metal may substantially match a full width of resistive channel Rch B 204, including a thinning edge region. Other alignments are possible. The spacing between adjacent resistive channels, e.g., the resistive channels Rch A and Rch B 204, may be approximately equal to a width of the resistive channel Rch B 204. This distance may be a minimum width that is easily fabricated according to the process by which the integrated circuit is manufactured.

Layers above the metal 114 are not shown, but will typically include insulation and/or passivation layers. Additional metal layers may also be included, particularly shielding metal layers overlying significant portions of a resistive device such as illustrated in FIGS. 1-3.

Alternatives

Although silicon is illustrated for the semiconductor channel of each resistive segment, any semiconductor material is suitable if very lightly doped. Also, although N-type doping is described, P-type doping may also be employed, and may have an advantage of higher bulk resistance. The doping of the bulk of each resistive channel is light, but typically of the same polarity as the connection regions, in the manner that would establish a low threshold-voltage depletion-type FET.

The resistive channels Rch A, Rch B, etc., are illustrated with metal overlay extending only from connection regions such as 306 and 308 of FIG. 3. However, a different arrangement may be fabricated by which the metallization 114 extends from connection regions at both ends of a resistive channel. For example, in one embodiment, the metallization 114 may extend from both the connection region 308 and the connection region 304, and it may be separated in the approximate middle of the length of the channel by a gap, such as the gap 116 shown in FIG. 3. This may be substantially similar to disposing an entire resistive channel pair, connected at the "blank" connection, between the connection regions 304 and 308. One difference may be the absence of a highly-doped connection region at the "blank" end of such segments. Were the layout illustrated in FIG. 3 modified accordingly, there would effectively be twenty resistive segments arranged in series, each connected in inverse orientation (i.e., the "blank" connection of one coupled to the "blank" connection of the next, and the "overlay" connection of each coupled to the "overlay" connection of the next resistive segment in the series string).

Although metal 114 is used in the illustrated process, any other relatively low impedance material, such as polysilicon, may be substituted for the metal. In addition, the metal, shown as Al—Si, may also comprise any suitable metal. Of course, many different insulators may be used, though $SiO_2$ is often convenient. The substrate need not be insulative, such as sapphire, but it is possible that steps may be needed to preclude unwanted leakages via some substrates, and to avoid possible modulations.

CONCLUSION

The foregoing description illustrates exemplary implementations, and novel features, of aspects of a high value resistor, and describes methods of making the same. The skilled person will understand that various omissions, substitutions, and changes in the form and details of the methods and apparatus illustrated may be made without departing from the scope of the teachings. Numerous alternative implementations have been described, but it is impractical to list all embodiments explicitly. As such, each practical combination of apparatus and method alternatives that are set forth above or shown in the attached figures, and each practical combination of equivalents of such apparatus and method alternatives, constitutes a distinct alternative embodiment of the subject apparatus or methods. Therefore, the scope of the presented teachings should be determined only by reference to such claims as may ultimately be allowed in conjunction with this application.

What is claimed is:

1. A high value resistive element in an integrated circuit, comprising a pair of resistive channel segments comprising a first resistive channel segment and a second resistive channel segment, wherein each resistive channel segment comprises:

a. an elongated resistive semiconductor channel disposed above a substrate having a vertical thickness and a length greater than its width, wherein the resistive semiconductor channel includes a first end contact region and a second end contact region positioned at opposite distal ends of the resistive semiconductor channel;
 b. an insulator layer disposed proximate and above the resistive semiconductor channel, wherein the insulator layer insulates the resistive semiconductor channel from other integrated circuit elements;
 c. a first and second well provided within the insulator layer and disposed proximate and above the first and second end contact regions, respectively;
 d. a first conductive layer extending into the first well and conductively coupled to the first end contact region, wherein the first conductive layer is further disposed above the insulator layer forming an overlay conductive layer extending over both the insulator layer and a portion of the resistive semiconductor channel, wherein the overlay conductive layer extends from the first end contact region toward the second end contact region, and wherein the overlay conductive layer overlays at least approximately half the length of the resistive semiconductor channel as measured from the first end contact region to the second end contact region; and
 e. a second conductive layer extending into the second well and conductively coupled to the second end contact region, wherein the second conductive layer and the overlay conductive layer are insulated from each other by a gap formed between the two conductive layers;

wherein the resistive channel segments are conductively coupled together at either of their first or second end contact regions, and wherein current flows in a first direction along the length of the first resistive channel segment and in a second direction along the length of the second resistive channel segment, and wherein the resistive channel segments are disposed within the integrated circuit such that the direction of current flow in the first segment is opposite the direction of current flow in the second segment.

2. The high value resistive element of claim 1, wherein the resistive channel segments are conductively coupled together by conductively coupling the first conductive layer of the first resistive channel segment to the first conductive layer of the second resistive channel segment.

3. The high value resistive element of claim 1, wherein the resistive channel segments are conductively coupled together by conductively coupling the second conductive layer of the first resistive channel segment to the second conductive layer of the second resistive channel segment.

4. The high value resistive element of claim 1, wherein the resistive channel segments are disposed in a parallel configuration such that the first channel segment is parallel to the second channel segment.

5. The high value resistive element of claim 4, wherein the resistive channel segments are disposed a selected distance apart from each other, and wherein the selected distance is approximately equal to a width of a channel segment.

6. The high value resistive element of claim 1, wherein the overlay conductive layer has a width that is approximately equal to the width of the resistive channel.

7. The high value resistive element of claim 1, wherein the resistive channel segments are conductively coupled together by a conducting metal layer.

8. The high value resistive element of claim 1, wherein the resistive channel segments are conductively coupled together by a conducting semiconductor channel.

9. The high value resistive element of claim 1, wherein the overlay conductive layer overlays at least approximately 90% of the length of the resistive semiconductor channel as measured from the first end contact region to the second end contact region.

10. A high value resistive device in an integrated circuit, comprising a plurality of high value resistive elements as defined by claim 1, wherein the resistive elements are conductively coupled together in a series configuration wherein a predecessor resistive element is conductively coupled to a subsequent resistive element, and wherein a voltage applied across the resistive device is divided approximately evenly between each resistive element of the series.

11. The high value resistive device of claim 10, wherein the resistive channel segments of each pair of channel segments are conductively coupled together at their first end contact regions, and wherein the resistive elements are conductively coupled together in series by conductively coupling the second end contact region of the second resistive channel segment of a predecessor resistive element to the second end contact region of the first resistive channel segment of a subsequent resistive element.

12. The high value resistive device of claim 10, wherein the resistive channel segments of each pair of channel segments are conductively coupled together at their second end contact regions, and wherein the resistive elements are conductively coupled together in series by conductively coupling the first end contact region of the second resistive channel segment of a predecessor resistive element to the first end contact region of the first resistive channel segment of a subsequent resistive element.

13. The high value resistive element of claim 1, wherein the resistive semiconductor channel is lightly doped in a manner suitable for a depletion-mode FET having a threshold voltage of between 0 and −2 volts.

14. The high value resistive element of claim 1, wherein the insulator layer has a thickness of at least approximately 2000 Angstroms.

15. The high value resistive element of claim 1, wherein the insulator layer has a thickness of approximately 10,000 Angstroms.

16. The high value resistive element of claim 1, wherein the substrate comprises an insulator, and wherein the resistive semiconductor channel comprises lightly-doped silicon.

17. The high value resistive element of claim 16, wherein the first and second end contact regions are heavily doped to enhance contact properties.

18. The high value resistive element of claim 1, wherein the first and second conductive layers comprise metal.

19. The high value resistive element of claim 18, wherein the metal overlay conductive layer reduces trapped charges occurring in the resistive channel, and wherein the metal overlay conductive layer also shields the resistive channel from voltage fields that can modulate the conductivity of portions of the channel.

20. The high value resistive device of claim 10, further comprising an additional shielding metal layer disposed above insulator layer, wherein the additional shielding metal layer overlays significant portions of the resistive device.

* * * * *